United States Patent [19]
Metcalf
[11] 3,716,849
[45] Feb. 13, 1973

[54] INTEGRATING MEASUREMENTS WITH NOISE REDUCTION

[75] Inventor: Eric Metcalf, Farnborough, England

[73] Assignee: The Solartron Electronic Group Limited, Farnborough, England

[22] Filed: June 8, 1970

[21] Appl. No.: 44,077

[30] Foreign Application Priority Data

June 10, 1970 Great Britain....................29,432/70

[52] U.S. Cl.......340/347 NT, 340/347 AD, 235/183, 324/99 D

[51] Int. Cl.............................................H03k 13/20

[58] Field of Search ...340/347; 235/183, 150.51, 92; 324/111, 120, 99 D, 99, 115; 328/127, 185, 165

[56] References Cited

UNITED STATES PATENTS

| | | | |
|---|---|---|---|
| 3,577,140 | 5/1971 | Aasnaes | 340/347 |
| 3,313,924 | 4/1967 | Schulz et al. | 235/150.51 |
| 3,121,160 | 2/1964 | Burk | 235/92 |
| 3,294,958 | 12/1966 | Du Vall | 235/92 |
| 3,316,751 | 5/1967 | Burk | 235/92 X |
| 3,449,725 | 6/1969 | Eckelkamp et al. | 340/347 X |
| 3,541,318 | 11/1970 | Miller | 235/183 |
| 3,480,948 | 11/1969 | Lord | 340/347 |
| 3,525,093 | 8/1970 | Marshall | 340/347 |
| 3,447,089 | 5/1969 | Foley | 340/347 X |
| 3,296,613 | 1/1967 | Andersen et al. | 340/347 T |
| 3,414,807 | 12/1968 | Evans | 324/115 X |
| 3,582,777 | 6/1971 | Wunderman | 324/115 X |

*Primary Examiner*—Charles D. Miller
*Attorney*—William R. Sherman, Stewart F. Moore, Jerry M. Presson and Roylance, Abrams, Kruger, Berdo and Kaul

[57] ABSTRACT

Noise rejection in an integrating type of analogue to digital converter is improved by effecting the integration in accordance with a variable weighting function, preferably a step function. Functions are described which flatten the response versus frequency curve in the neighborhood of the zeroes and introduce more zeroes into this curve. The weighting may be introduced by scaling either on the analogue side or the digital side of the instrument.

17 Claims, 10 Drawing Figures

INTEGRATING MEASUREMENTS WITH NOISE REDUCTION

This invention relates to a method of measuring an analogue signal wherein the signal is integrated and the weight with which such integration is effected is varied during the course of the measurement. The invention also concerns a measuring circuit for performing the measurement.

This invention relates generally to measurement techniques involving integration of an analogue signal, particularly but not exclusively as in analogue to digital converters such as digital voltmeters and other digital measuring instruments in which the analogue input is integrated over a measurement period. It is well known that noise at a particular frequency can be rejected by making the measurement period equal to or an integral multiple of the period of the noise signal. Thus many commercially available digital voltmeters integrate over a 20ms period to reject 50Hz mains hum.

There are many situations in which it is inconvenient or impossible to ensure that the measurement period and the noise period are equal. There may for example be two noise signals at unrelated frequencies or the analogue to digital converter may be a battery operated instrument from which it is desired to exclude any signal at the noise frequency which could be used to synchronize the measurement cycle to obtain equality of the two periods. Even if the measurement period only differs from the noise period by 2 percent, the noise rejection achieved is no better than 34db.

The object of this invention is to provide an improved circuit which can achieve substantially better noise rejection than heretofore in many situations.

According to the present invention there is provided a measurement circuit comprising integrating means arranged to integrate an electrical analogue signal over a measurement period, characterized by control means operative to vary the weight with which the signal is integrated during the course of the measurement period in accordance with a predetermined weighting function. Preferably the weighting function is a step function.

If the circuit is an analogue to digital converter it will comprise counting means for converting the integral to a digital count and the weight with which the signal is integrated can be varied either by scaling on the analogue side of the circuit or by digital scaling on the digital side.

The theoretical basis of the invention thus defined and the advantageous effects obtainable thereby will be explained in the following description, given by way of example, with reference to the accompanying drawings, in which.

Figure 6:
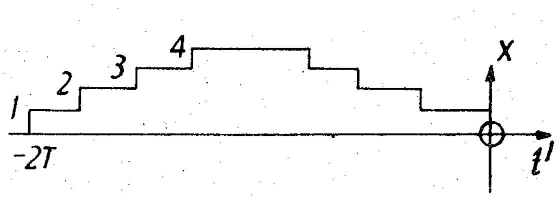
Figure 4:
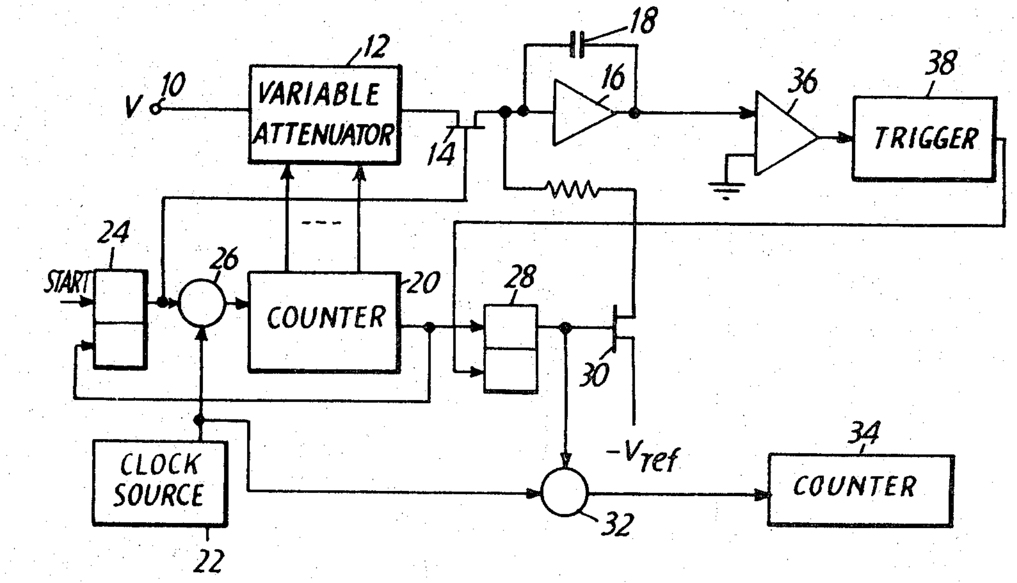
FIG. 4 is a block diagram of one embodiment of the invention.
Figure 5:
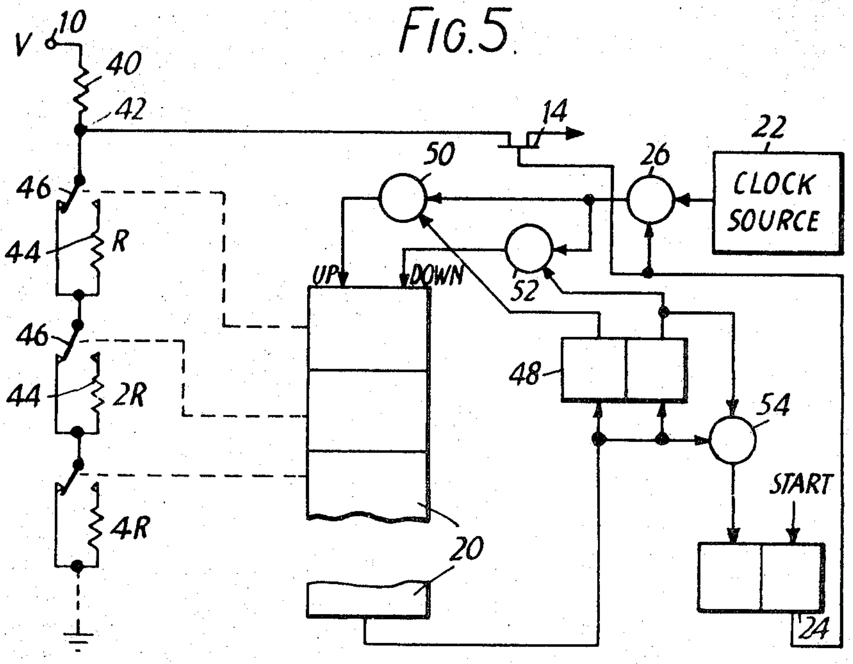
Figure 7:
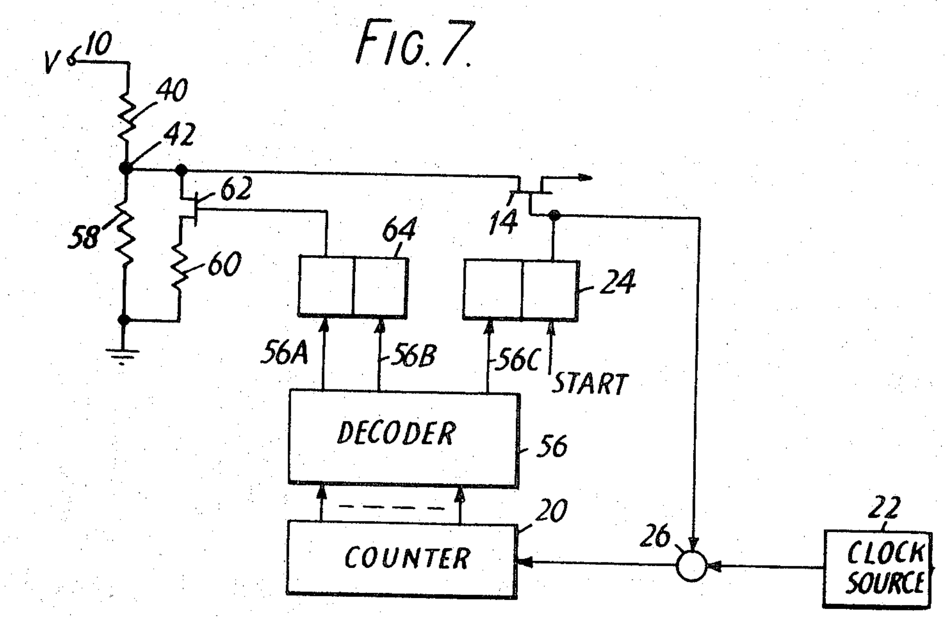
Figure 8:
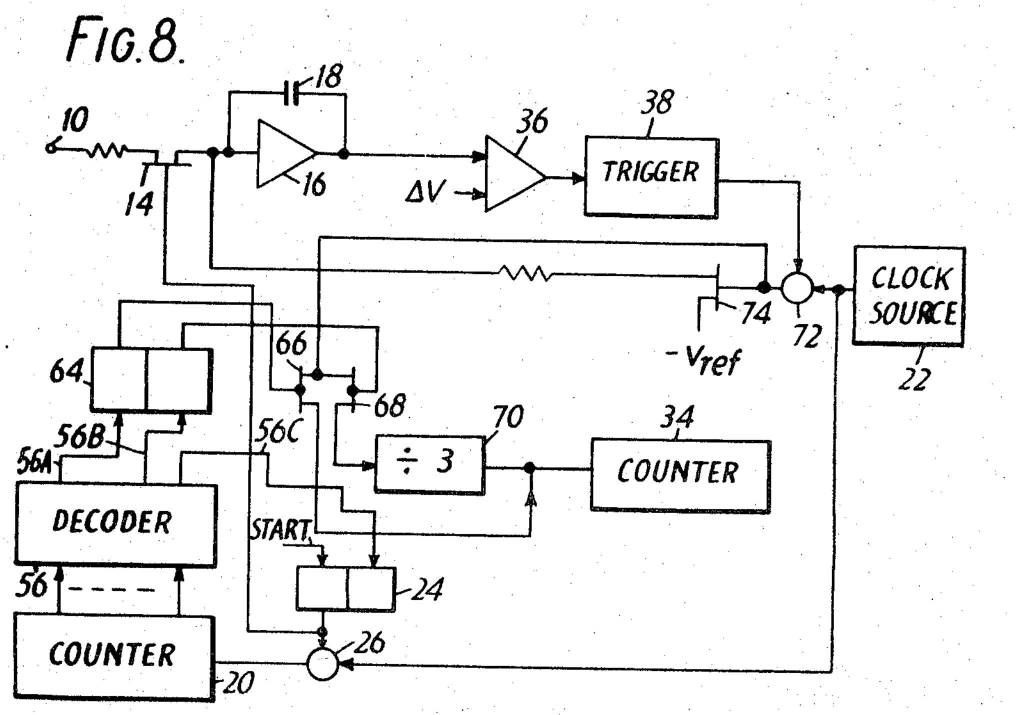
Figure 9:
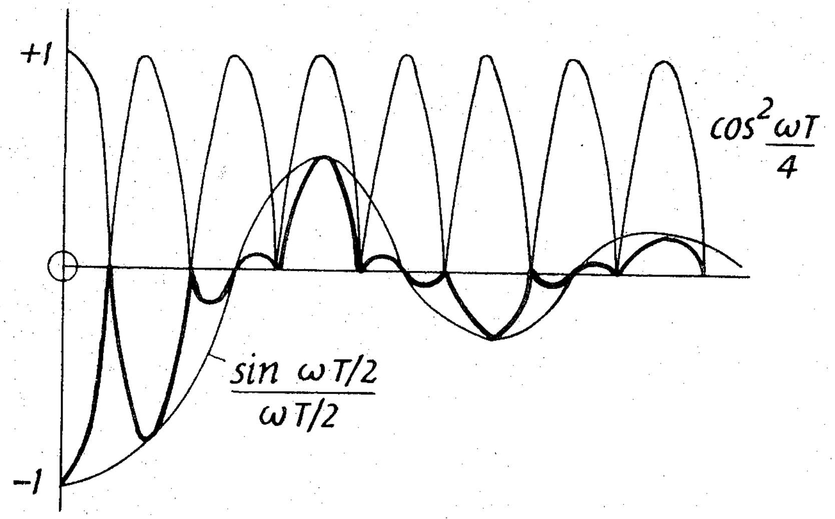
Figure 10:
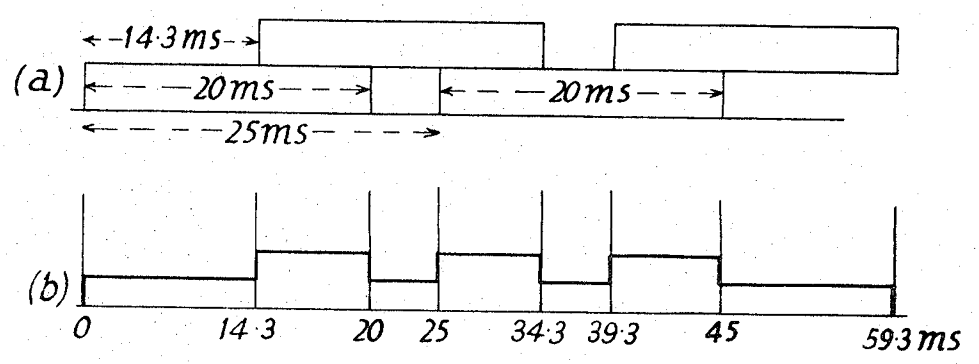

FIG. 5 shows part of FIG. 4 in more detail, the rest of the circuit being as in FIG. 4, FIG. 6 shows another weighting function, FIG. 7 is a partial block diagram of a second embodiment of the invention, FIG. 8 is a partial block diagram of a third embodiment of the invention, FIG. 9 illustrates the response curve for FIGS. 7 and 8, and FIG. 10 illustrates a different weighting schedule for removing several frequencies.

It will be convenient to consider basic operations of integration and sampling. We can define the basic operation of integrating a voltage V over a period T to measure $V_o$, the average value of V, as:

$$V_0=\frac{1}{T}\int_{t-T}^{t} V.dt$$

Figure 1:
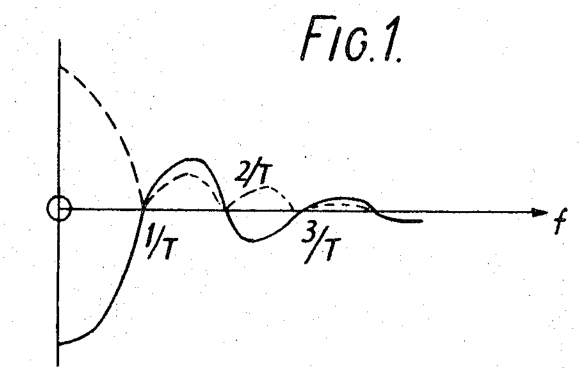
FIGS. 1 and 2 show response versus frequency noise rejection characteristics.

We are interested in the situations where V is periodic and the magnitude of the response to an input sin wt is the function $(\sin wT/2)/(wT/2)$ whose shape is illustrated in FIG. 1 by the full line curve. There is infinite rejection of noise at frequency $f=1/T$ and all harmonics thereof.

Figure 2:
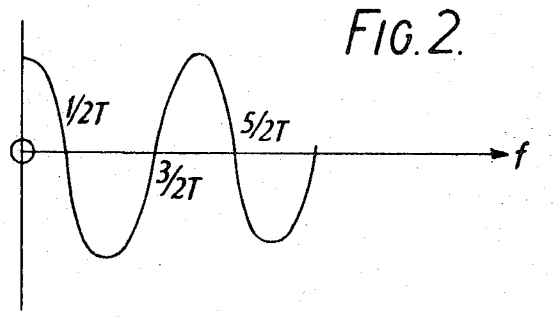

The basic operation of sampling can be defined similarly as $V_o=\frac{1}{2}(V_t+V_{t-T})$ and the response to sin wt is $\cos wT/2$ which is illustrated in FIG. 2. There is infinite rejection at $f=1/2T$ and all odd harmonics thereof. Sampling operations will be considered later on; for the time being a development of simple integration will be considered.

The basic operations defined above are both linear and accordingly, when used in serial combination their responses can be multiplied together to give the overall response. Thus if double integration is effected we have a response to sin wt of $(4/w^2T^2)\sin^2 wT/2$ which is indicated in broken lines in FIG. 1. It can be seen intuitively that rejection at frequencies slightly displaced from $f=1/T$ is improved, because of the flattening of the humps in the curve. In fact, if the noise frequency $f$ differs from the reciprocal of the measurement period T by 2 percent, the 34db rejection for single integration becomes 68db for double integration.

A result identical to that produced by double integration can be achieved by single integration of the input waveform over a period $2T$, i.e. from $t-2T$ to $t$, weighted by a function.

$$X=(t'+2T/T)\text{ for }-2T<t'\leq -T$$
$$=-t'/T\text{ for }-T<t'\leq 0$$
$$=0\text{ elsewhere}$$

where $t'=0$ at the end of the measurement period.

Figure 3:
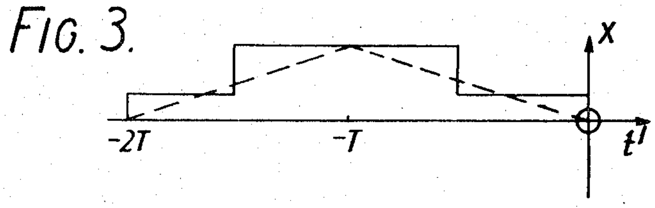
FIG. 3 illustrates integration weighting functions.

This weighting function is shown in broken lines in FIG. 3 and the first embodiment of the invention to be considered is an analogue to digital converter which will effect integration while varying the weight with which V is integrated substantially continuously in accordance with the function of FIG. 3. FIG. 4 shows by way of example a dual ramp analogue to digital converter, that is to say an analogue to digital converter which first ramps up during the measurement period and then ramps down in response to a reference input $-V_{ref}$, the time taken to ramp down being measured by counting clock pulses.

Thus in FIG. 4 the input V of one polarity is applied from terminal 10 through an attenuator 12, whose function will be described below, and a switch 14 to an integrating amplifier 16 with feedback capacitor 18. The integrator ramps up to $V_o$ from a datum level during the measurement period 2T which is defined by a control counter 20 counting pulses from a source 22.

The measurement period commences when a start signal sets a bistable 24 which closes the switch 14 and opens an AND gate 26 to allow pulses from the clock source 22 into the counter 20.

When the counter fills it resets the bistable 24 to terminate the measurement period and sets a bistable 28 to initiate the ramp down. Thus the bistable 28, when set, closes a switch 30 to connect $-V_{ref}$ (of opposite polarity to V) to the amplifier 16 and also opens a gate 32 to allow the clock pulses to pass into a measurement counter 34. (In practice the counters 20 and 34 may be a single, time-shared counter.) A comparator amplifier 36 and trigger circuit 38 detect return of the ramp to datum and reset the bistable 28. The number now in the counter 34 represents the integral of V.

Apart from the attenuator 12, the analogue to digital converter as described above is a well known instrument, and accordingly description in any greater detail would be superfluous. The attenuator 12 is used in accordance with the present invention to develop the weighting function X and to this end it is controlled from the counter 20 so as to decrease the attenuation linearly from infinity to a fixed value during the first half of the measurement period and then linearly back to infinity in the second half. There are several ways in which this can be effected but FIG. 5 shows one possibility.

The terminal 10 is connected through a fixed resistor 40 to a terminal 42 which is connected to the switch 14. The terminal 42 is also connected to earth through a tree of resistors 44 and controlling switches 46, the resistors having binary weighted values, such that as the switches 46 are changed over in combinations according to the binary code a succession of resistor values R, 2R, 3R, etc. are switched in between the terminal 42 and earth. Changeover contacts are illustrated for convenience; in practice pairs of complementary semiconductor switches would be used.

For convenience in controlling the switches 46 the counter 20 is a reversible binary counter which counts up for T and then counts down again for T. The stages of the counter, other than the last stage, directly control the corresponding switches 46 as indicated by broken line connections. Whenever a 1 appears in the last stage of the counter 20, irrespective of the direction of counting, a further bistable 48 is caused to change state. Initially this bistable is in a first state in which a gate 50 is open to cause the counter to count up in response to the clock pulses. When the bistable 48 changes to the second state it opens a gate 52 to cause the counter to count down again. When the counter goes from 0 - - - - 00 to 1 - - - - 11 the bistable 48 reverts to the first state but in addition a pulse is passed by a gate 54, which is only open when the bistable 48 is in the second state, to reset the bistable 24 and thus terminate the measurement period.

Since the weighting function X effects V exclusively in a linear manner, the final number in the counter 34 is proportional to V and it is accordingly possible to scale the counter 34 to read V directly, preceding the counter by a frequency divider or multiplier if necessary. These comments apply to the embodiments described below.

The above embodiment assumed that X will be changed by a very small increment at every clock pulse. As 2T may be defined by a number of clock pulses in the region of $10^4$ this requires a certain amount of complexity in the attenuator 12. In practice such complexity is unnecessary and a very useful approximation to double integration can be made with a very small number of steps in X. The simplest approximation is shown by the full line in FIG. 3 where X has a low value for $-2T < t' \leq -3T/2$ and for $-T/2 < t' \leq 0$ and has a high value for $-3T/2 < t' \leq -T/2$. The high value is preferably three times the low value. FIG. 6 shows a better approximation involving four step levels. FIG. 7 shows how the embodiment of FIGS. 4 and 5 can be modified to achieve the simple stepped weighting function of FIG. 3.

It is now assumed that the counter 20 is a simple, forward counting, 13 - stage binary counter which counts from 0 to say 8192 to define $2T$. The counter is connected to a decoder 56 which in this embodiment decodes the counter states 2048, 6144 and 8192 corresponding to $-3T/2$, $-T/2$ and $t' = 0$ respectively, providing signals on lines 56A, 56B and 56C respectively.

The attenuator 12 now comprises the fixed resistor 40, another fixed resistor 58 connected between the terminal 42 and earth and a resistor 60 which is connected in shunt with the resistor 58 when a switch 62 is closed. The switch 62 is controlled by a bistable 64 which is set to close switch 62 by the signal on line 56A and reset by the signal on line 56B. The signal on line 56C resets the bistable 24 (and sets the bistable 28).

So far the weighting has been performed on the signal V by variable attenuation thereof. This is perhaps the only convenient way if X is to vary substantially continuously. When X varies by a few steps only, as in FIG. 7, it may be better to perform the weighting on the digital side of the instrument. FIG. 8 shows a circuit for achieving this, also illustrating the application of the invention to another kind of analogue to digital converter. The analogue to digital converter is here of the type in which a voltage to frequency converter feeds a counter, the integral of the analogue signal thus being formed as the digital count in the counter accumulated during the measurement period. In the particular voltage to frequency converter illustrated, standard units of charge are fed into the integrator continuously in opposition to the input signal. The attenuator 12 is no longer included and the bistable 64 now controls two switches which determine whether pulses go direct to the counter 34 or through a divide by three circuit 70.

The comparator amplifier now has a small positive threshold $\Delta V$ and, whenever this is exceeded, the trigger 38 is set and opens a gate 72 to pass pulses from the clock source 22. These gated clock pulses close a switch 74 to connect $-V_{ref}$ through a resistor to the amplifier 16 for a predetermined length of time, determined by the clock pulse width, and thus each pulse passing through the gate 72 feeds a standard unit of charge into the integrator to oppose the effect of V. The output of the integrator is never allowed to deviate from earth by substantially more than $\Delta V$. The frequency of the pulses passing through the gate 72 is proportional to V. The measurement period 2T is timed as before by the counter 20 and the number of pulses gated through the gate 72 in this period is proportional to the integral of V and hence proportional to V if V is constant.

To this end the gated pulses are counted by the counter 34 but, in accordance with the present invention, the pulses are weighted differently in different parts of the measured period. Initially the bistable 64 keeps the switch 68 closed and the pulses pass through the divide by three circuit 70. At $-3T/2$ the output on line 56A sets the bistable 64, the switch 68 opens and the switch 66 closes to pass the gated pulses direct to the counter 34. At $-T/2$ the output on line 56B resets the bistable 64 to reintroduce the divide-by-three circuit 70. At $t'=0$ the signal on line 56C resets the bistable 24 as heretofore to terminate the measurement.

It is clear that the decoder 56 of FIG. 7 or FIG. 8 can be arranged to provide outputs at any desired instants within the period $-2T$ to 0 and these outputs can obviously be used to switch in and out attenuator circuits or divider circuits so as to establish any desired weighting schedule for the integration over 2T. An explanation will now be given of how the combined concepts of integration and sampling can be used to build up suitable weighting schedules.

The weighting schedule of FIG. 3 can be regarded as built up from a double sampling procedure, each sample being taken as a simple integral over a period T. The basic response established by integration is the full line curve of FIG. 1. The basic sampling procedure involves a pair of samples separated by $T/2$ thus giving the response curve cos $wT/4$. The basic sampling is repeated at a spacing of $T/2$, giving again the response curve cos $wT/4$. The resulting curve $\cos^2(wT/4)$ is shown in FIG. 9 with the curve $(\sin wT/2)/(wT/2)$. The product of these curves is a much flatter curve than the basic curve of FIG. 1, being illustrated in FIG. 9 by the heavy line.

In the above-described weighting schedule the sampling interval is simply related to the integrating period (i.e. $T/2$ as to $T$) but this is not necessary. The integration can be performed over $T_1$, the basic sampling with a separation $T_2$ and a repeated sampling at $T_3$, $T_1$, $T_2$ and $T_3$ being so selected as to give zeroes in the product response curve at all positions necessary to remove noise at two or even three different frequencies. Suppose for example noise is present at 50Hz, 20Hz and 35Hz. $T_1$ can be made $1/50s. = 20$ms, $T_2$ can be made $1/40s. = 25$ms and $T_3$ can be made $1/70s. = 14.3$ms. The resulting pattern of integrated samples is shown in FIG. 10(a) and these combine to give the weighting schedule shown in FIG. 10(b). Thus in FIG. 7 or FIG. 8 the counter 20 and decoder 56 would have to be preset to give a measurement period of 59.3ms. and to set the bistable 64 at 14.3, 25 and 39.3ms and to reset the bistable at 20, 34.3 and 45ms. The integration is weighted with factors 1 and 2 in the reset and set states respectively of the bistable.

Clearly even this is a relatively straightforward weighting schedule — it only requires two different weighting levels. Other more complex schedules can readily be devised following the above teaching.

In summary, the absolute value of the product response curve is unity of $f=0$, i.e. maximum sensitivity exists for the dc signal of interest. The response curve goes to zero at various values of $f$ which values can be positioned to remove more than one noise frequency. Alternatively or additionally the general flattening of the response curve resulting from multiplying the basic curve of FIG. 1 with one or more other curves, e.g. cosine curves, leads to better rejection of frequencies slightly removed from the zeroes in the response curve. This latter feature is especially important when the analogue to digital converter cannot be synchronized to the noise frequency and hence when it is impossible to ensure that a zero in the response curve occurs exactly at the noise frequency.

As described so far all weighting functions have had non-zero values throughout the measurement period but the weighting function can alternate between finite values and zero, effectively providing a plurality of integrated samples which are moreover cumulatively integrated. The weighting function can be varied only from sample to sample or only during each sample or both within the samples from sample to sample. Any such schedule can readily be set up following the basis of FIG. 8 for example. In this circuit, when the function is required to be zero neither switch 66 nor 68 would be closed.

Embodiments have been described in which the weighting is varied on the digital side of the circuit and on the analogue side. This latter alternative can also be applied to a purely analogue circuit in which the integrator 16, 18 accumulates the whole integral throughout the measured period.

I claim:

1. In an analog to digital conversion circuit for converting an analog signal which can include undesirable alternating noise signal components to a digital representation thereof the combination of timing means for defining a measurement period whose duration is an integral multiple of the period of at least one of said noise signal components; integrating means for integrating the analog signal over said measurement period; and control means responsive to said timing means for varying the weight with which the analog signal is integrated during said measurement period in accordance with a predetermined weighting function, which function is selected to enhance rejection of said at least one of said noise signal components.

2. A circuit according to claim 1, wherein the weighting function first increases and then decreases during the measurement period.

3. A circuit according to claim 2, wherein the weighting function increases and then decreases substantially continuously.

4. A circuit according to claim 1, wherein the weighting function is symmetrical about the middle of the measurement period.

5. A circuit according to claim 1, wherein the weighting function is a step function.

6. A circuit according to claim 5, wherein the weighting function first increases stepwise by at least one step and then decreases stepwise by at least one step.

7. A circuit according to claim 6, wherein the weighting function has an initial non-zero value, increases to three times this value one quarter of the way through the measurement period and decreases to the initial value three quarters of the way through the measurement period.

8. A circuit according to claim 5, wherein the weighting function alternates between two values a plurality of times during the measurement period.

9. A circuit according to claim 1, wherein the control means scales the analog signal applied to the integrating means in accordance with the weighting function during the measurement period.

10. A circuit according to claim 9, wherein said control means comprises a source of clock pulses, a counter for counting pulses from said clock to determine the measurement period and a switched attenuator preceding the integrating means for scaling the analogue signal, the switched attenuator being controlled by the counter.

11. A circuit according to claim 10, wherein the attenuation provided by the attenuator decreases in the first half of the measurement period by small steps, one per clock pulse, and thereafter increases by small steps, one per clock pulse.

12. A circuit according to claim 10, comprising a decoder for decoding a plurality of states of the counter corresponding to predetermined points within the measurement period, the switched attenuator being controlled by the decoder to vary the attenuation stepwise at the said points.

13. A circuit according to claim 12, wherein the attenuation alternates between two values at the said points.

14. A circuit according to claim 1, wherein the circuit further comprises a voltage to frequency converter responsive to the analogue signal and a counter for counting pulses from the voltage to frequency converter during the measurement period to form a digital count constituting the integral of the analogue signal, the control means scaling the pulses digitally as counted by the counter.

15. A circuit according to claim 14, wherein the control means comprise at least one pulse divider preceding the counter and switching means for switching this divider in and out of circuit at predetermined points within the measurement period.

16. A circuit according to claim 15, wherein the control means comprise a source of clock pulses, a further counter for counting these pulses to determine the measurement period, and a decoder for decoding a plurality of states of the counter corresponding to the said points and for controlling the switching means.

17. A method of converting an electrical analog signal to a digital representation thereof while improving the rejection of undesirable alternating noise components which can accompany the signal, including establishing a measurement interval whose duration is an integral multiple of the period of at least one of said noise signal components, integrating the analog signal, together with any undesirable components, over the measurement interval, and varying the weight with which the signal is integrated during the measurement interval in accordance with a predetermined weighting function, which function is selected to enhance rejection of anticipated noise components.

* * * * *